(12) United States Patent
Luo et al.

(10) Patent No.: US 10,559,344 B2
(45) Date of Patent: Feb. 11, 2020

(54) HYBRID NON-VOLATILE MEMORY DEVICES WITH STATIC RANDOM ACCESS MEMORY (SRAM) ARRAY AND NON-VOLATILE MEMORY (NVM) ARRAY

(71) Applicant: Aspiring Sky Co. Limited, Hong Kong (CN)

(72) Inventors: Zhijiong Luo, Hopewell Township, PA (US); Shu Wang, Shanghai (CN); Xiaoming Jin, Shanghai (CN)

(73) Assignee: Aspiring Sky Co. Limited, Hong Kong (CN)

( * ) Notice: Subject to any disclaimer, the term of this patent is extended or adjusted under 35 U.S.C. 154(b) by 111 days.

(21) Appl. No.: 15/704,011

(22) Filed: Sep. 14, 2017

(65) Prior Publication Data
US 2018/0081802 A1    Mar. 22, 2018

Related U.S. Application Data

(60) Provisional application No. 62/395,581, filed on Sep. 16, 2016.

(51) Int. Cl.
*G11C 14/00* (2006.01)
*G11C 11/408* (2006.01)
(Continued)

(52) U.S. Cl.
CPC ...... *G11C 11/4085* (2013.01); *G06F 12/0246* (2013.01); *G06F 12/0638* (2013.01); *G06F 13/1694* (2013.01); *G11C 5/025* (2013.01); *G11C 7/12* (2013.01); *G11C 7/18* (2013.01); *G11C 8/08* (2013.01); *G11C 8/10* (2013.01); *G11C 11/419* (2013.01); *G11C 14/0063* (2013.01); *G06F 2212/1016* (2013.01); (Continued)

(58) Field of Classification Search
CPC ............ G11C 11/1675; G11C 11/1673; G11C 11/1659; G11C 11/1697; G11C 11/1655; G11C 11/1657; G11C 11/161; G11C 13/0069; G11C 13/0002
See application file for complete search history.

(56) References Cited

U.S. PATENT DOCUMENTS 6,525,562 B1    2/2003  Schultz et al.
8,861,271 B1    10/2014 Zain
(Continued)

OTHER PUBLICATIONS

Single-chip Integration of SRAM and Non-volatile Memory using Bit-line sharing (2006 IEEE) 2006 Proceedings of the 32nd European Solid-State Circuits Conference, pp. 295-298.

*Primary Examiner* — David Lam
(74) *Attorney, Agent, or Firm* — Hertzberg, Turk & Associates, LLC (57) ABSTRACT

Technologies are generally described herein for a hybrid non-volatile memory structure that includes a number of SRAM buffers. SRAM access times may be achieved for non-volatile read/write operations by performing access queue buffered read/write operations first. The SRAM buffer may be shareable as a system SRAM. In other examples, a hybrid non-volatile memory according to some embodiments may include a high speed block and a high endurance block to store different types of data with different access needs. The hybrid non-volatile memory may also include a normal block to store the data which is non-frequently changed.

20 Claims, 10 Drawing Sheets

(51) Int. Cl.

| | | |
|---|---|---|
| *G11C 8/10* | (2006.01) | |
| *G11C 5/02* | (2006.01) | |
| *G11C 7/12* | (2006.01) | |
| *G11C 7/18* | (2006.01) | |
| *G11C 8/08* | (2006.01) | |
| *G11C 11/419* | (2006.01) | |
| *G06F 12/02* | (2006.01) | |
| *G06F 12/06* | (2006.01) | |
| *G06F 13/16* | (2006.01) | |
| *G11C 11/418* | (2006.01) | |
| *G11C 16/08* | (2006.01) | |

(52) U.S. Cl.
 CPC ............. *G06F 2212/1028* (2013.01); *G06F 2212/205* (2013.01); *G06F 2212/7203* (2013.01); *G11C 11/418* (2013.01); *G11C 14/00* (2013.01); *G11C 16/08* (2013.01); *Y02D 10/13* (2018.01); *Y02D 10/14* (2018.01)

(56) References Cited

U.S. PATENT DOCUMENTS

| | | | |
|---|---|---|---|
| 9,318,196 | B1 | 4/2016 | Kasai |
| 9,349,440 | B1 | 5/2016 | Ma |
| 9,473,204 | B2 | 10/2016 | Lin et al. |
| 9,640,256 | B1 | 5/2017 | Roy |
| 2003/0001615 | A1 | 1/2003 | Sueyoshi et al. |
| 2007/0297396 | A1 | 12/2007 | Eldar |
| 2008/0195803 | A1* | 8/2008 | Park ............... G06F 12/0246 711/103 |
| 2011/0087841 | A1* | 4/2011 | Toh ............... G06F 12/0817 711/122 |
| 2013/0207170 | A1 | 8/2013 | Kurokawa |
| 2014/0085978 | A1* | 3/2014 | Lee ............... G11C 14/0063 365/185.08 |
| 2014/0368235 | A1 | 12/2014 | Aoki et al. |
| 2015/0348621 | A1 | 12/2015 | Sako |
| 2016/0078938 | A1 | 3/2016 | Hsu |
| 2016/0098811 | A1* | 4/2016 | Lu ............... G06T 1/20 345/522 |
| 2016/0173103 | A1 | 6/2016 | Gao et al. |

* cited by examiner

HYBRID NON-VOLATILE MEMORY DEVICES WITH STATIC RANDOM ACCESS MEMORY (SRAM) ARRAY AND NON-VOLATILE MEMORY (NVM) ARRAY

CROSS REFERENCE TO RELATED APPLICATIONS

This application claims the benefit of U.S. Provisional Patent Application Ser. No. 62/395,581 filed on Sep. 16, 2016. The disclosures of the above application are hereby incorporated by reference for all purposes.

BACKGROUND

Unless otherwise indicated herein, the materials described in this section are not prior art to the claims in this application and are not admitted to be prior art by inclusion in this section.

Volatile semiconductor memories such as static random-access memory (SRAM) or DRAM may be utilized in computer design because of their relatively low power consumption, speed, high speed, and simple operation, while non-volatile memories (NVM) such as one time programmable (OTP) memory, EEPROM, flash memory, or even PCM, have the advantage of storing configuration data, even when a flash-equipped device is powered on or off.

Many of today's system architectures, utilize both the volatile memory and the non-volatile memory devices, generally implemented separately. Because the memories devices are not in the same array layout, large area may be consumed by the system architecture. Further, it may reduce speed of transferring data from SRAM to NVM.

Accordingly, a need continues to exist for a relatively small non-volatile SRAM that consumes less power and improves transfer speed performance.

SUMMARY

Briefly stated, technologies are generally described herein for hybrid non-volatile memory (HNVM) structures and methods thereof such as floating gate memory devices, SONOS memory devices, resistive RAM (RRAM) devices, phase change memories, ferroelectric memories, magnetic base memories (e.g., MRAM and STTRAM), DRAM devices, one time programmable memories (OTPs) or multiple time programmable memories (MTPs).

According to some examples, a hybrid non-volatile memory structure is provided that include a number of SRAM buffers. SRAM access times may be achieved for non-volatile read/write operations by performing access queue buffered read/write operations first. The SRAM buffer may be shareable as a system SRAM. In other examples, a hybrid non-volatile memory according to some embodiments may include a high speed block and a high endurance block to store different types of data with different access needs. The HNVM may also include a normal block to store the data which is non-frequently changed. Another configuration may be a method to operate a hybrid non-volatile memory device.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail though use of the accompanying drawings, in which:

all arranged according to at least some embodiments presented herein.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description and drawings are not meant to be limiting. Other embodiments may be utilized, and other changes may be made, without departing from the spirit or scope of the subject matter presented herein. The aspects of the present disclosure, as generally described herein, and illustrated in the figures, can be arranged, substituted, combined, separated, and designed in a wide variety of different configurations, all of which are explicitly contemplated herein.

As used herein, NVM memory may include, but is not limited to, floating gate memory devices, SONOS memory devices, resistive RAM (RRAM) devices, phase change memories, ferroelectric memories, magnetic base memories (e.g., MRAM and STTRAM), DRAM devices, one time programmable memories (OTPs) or multiple time programmable memories (MTPs).

Figure 1:
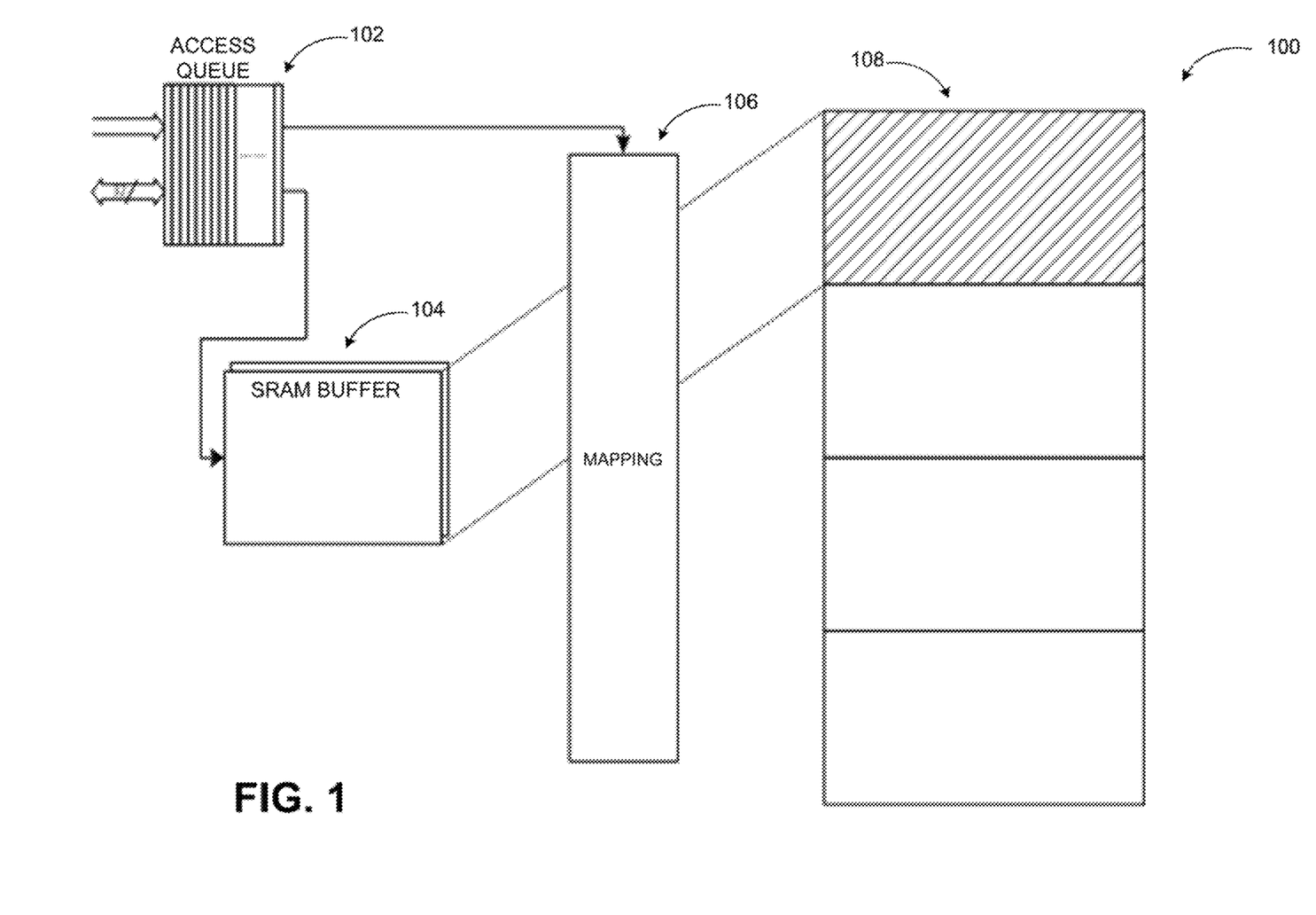
FIG. 1 is a block diagram illustrating an example HNVM architecture.

FIG. 1 is a block diagram illustrating an example HNVM architecture, arranged in accordance with at least some embodiments described herein.

As shown in diagram 100, SRAM access times may be achieved for non-volatile memory read/write operations. in some examples, a generic SRAM interface may be used with normal word width such as 32 bit for a 32 bit microcontroller unit (MCU). Non-volatile memory space may be divided into n SRAM buffers sized windows (104) and, therefore, NVM (108) mapped to SRAM (104) through mapping logic (106). Access queue 102 buffered read write operations may be performed firstly. SRAM buffer may be configured sharable as a system SRAM.

In example implementations of embodiments, various types of transistors may be used. The disclosure may use, for purposes of illustration, metal-oxide semiconductor field effect transistors (MOSFET). A MOSFET may have a source terminal (e.g., a first terminal), a drain terminal (e.g., a second terminal), and a control terminal. When an appropriate level of bias signal is applied to the control terminal, the transistor may be activated (e.g., biased into active operation) wherein conduction between the source terminal and the drain terminal may be facilitated. Depending on the type of transistor (e.g., N-type or P-type), an appropriate level of bias signal may be applied, or previously applied bias signal may be removed, to cause the transistor to be deactivated wherein conduction between the source and the drain may be abated. A MOSFET "terminal" may also be termed a "port."

The NVM array 108 having a plurality of NVM memory cells may implemented in some examples in a matrix by m rows coupled to a plurality of word lines (e.g., first word line nvWL0, mth word line nvWLm, etc.) and x columns coupled to bit lines (nvBL0 to nvBL0#). An example NVM cell may include two floating gate field effect transistors (FETs) in a differential configuration. The floating gate memory transistor having a gate region, a source region and a drain region. The transistors may be arranged in parallel in columns with their drain connect to a common drain or bit line, and their source to a common source line.

The gate of the example NVM cell may connected to the word-line nvWL0 and a source to drain (S/D) terminal of the cell may connected to a bit-line nvBL0/nvBL0# and a source-line nvSL0. A first set of bit lines may be connected to a drain region of memory transistor in each of the memory cells in a respective column nvBL0. A second set of bit lines may each provide a source line nvSL0 that is electrically connected to a source region of memory transistor in each of the memory cells along a respective column. The common source line nvSL0 and nvSLx may be separated individually or connected together.

Figure 2:
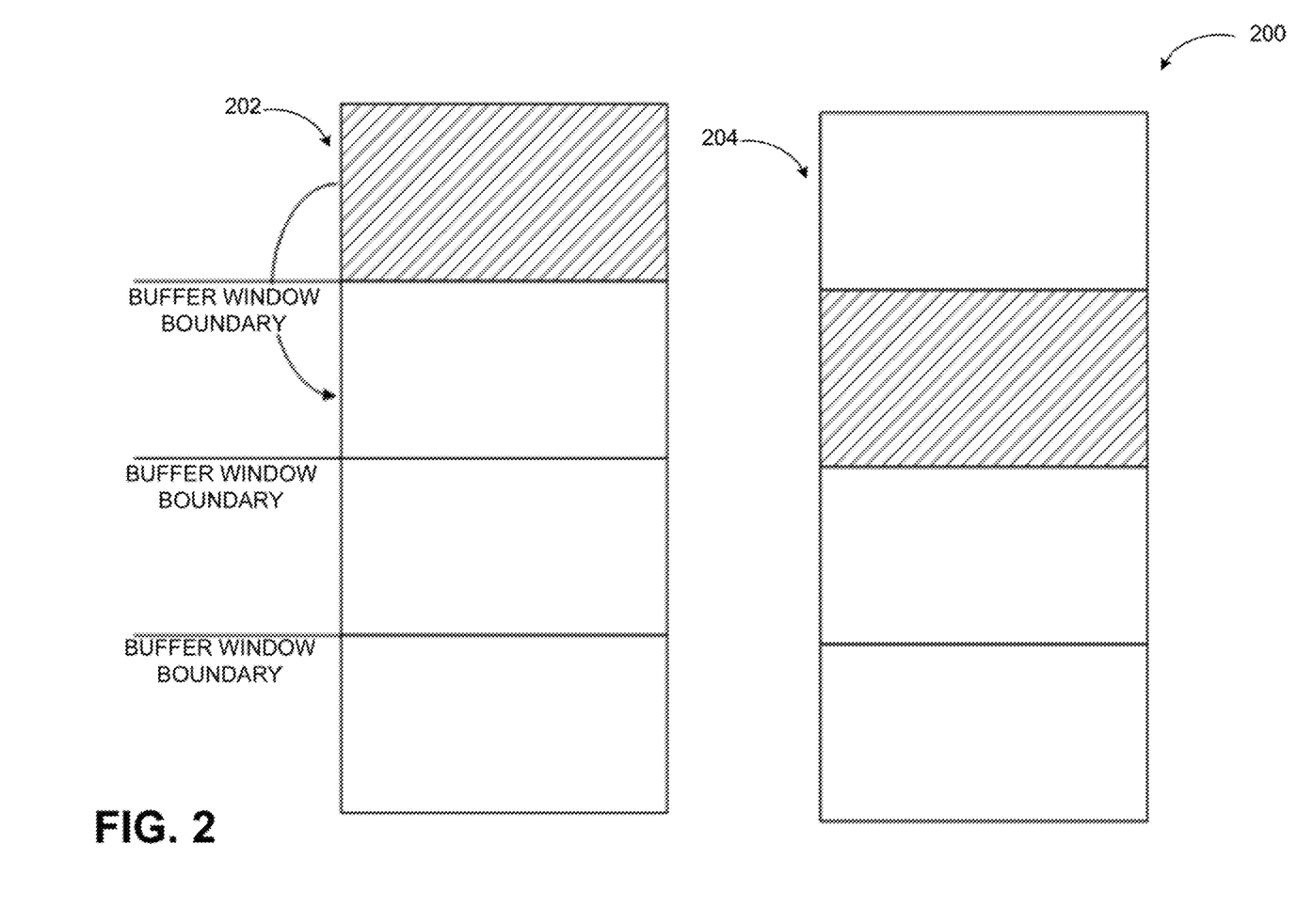
FIG. 2 illustrates an active SRAM window before Flash access.

FIG. 2 illustrates Flash access crosses SRAM window boundary, arranged in accordance with at least some embodiments described herein.

Diagram 200 shows an active SRAM window before Flash access (202). The arrowed curve indicates next access will cross SRAM buffer window boundary. The SRAM window is switched (204) or the mapping logic active the target SRAM window buffer when the read/write operations is across buffer window boundary. A pre-active block may be mapped before accessing a non-active block. Double (also triple or more) buffers may be used in the SRAM structure. One buffer may be stored to flash and another buffer may be mapped to SRAM simultaneously. Mapping may depend on access queue.

Figure 3:
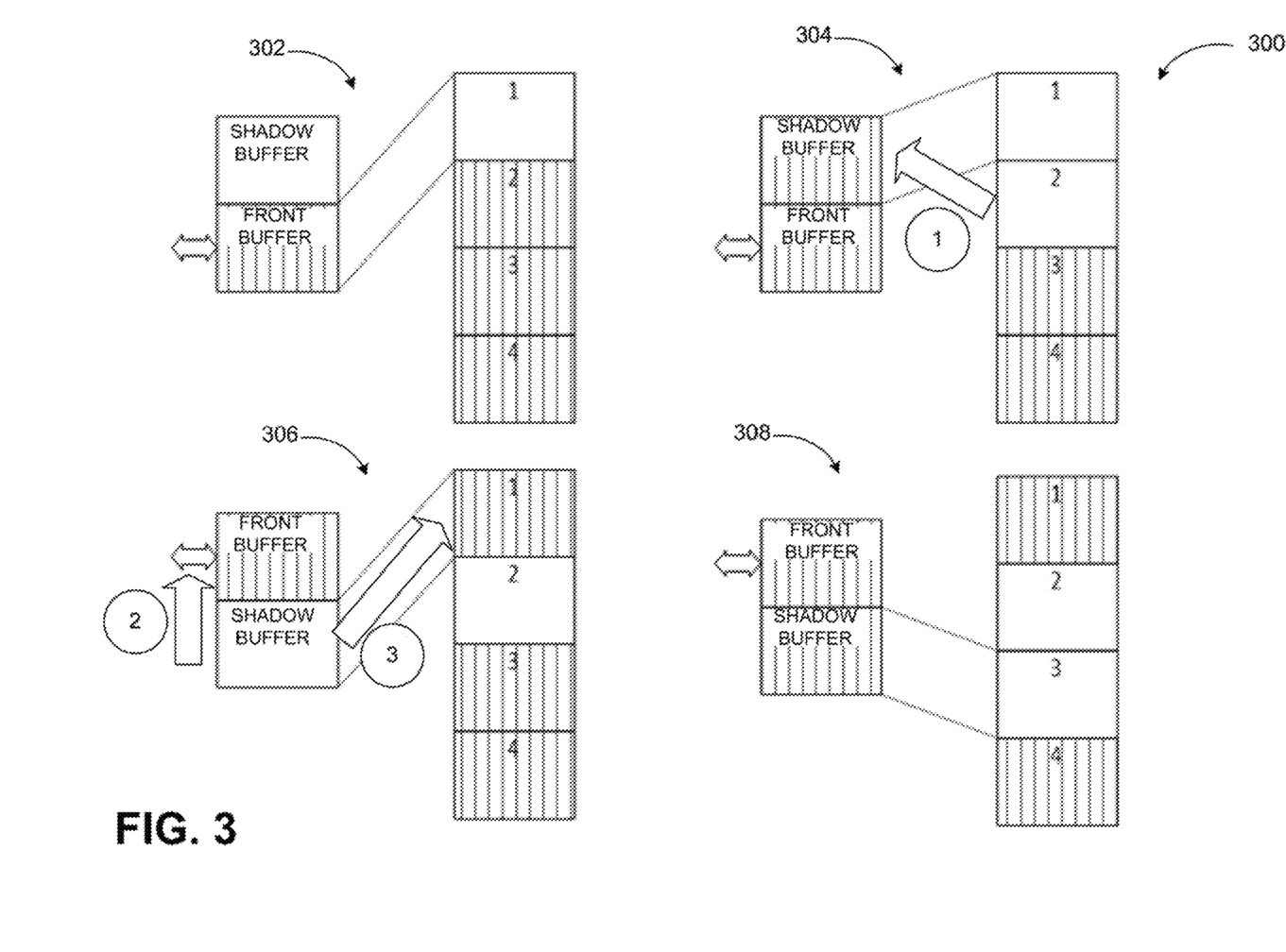
FIG. 3 illustrates a double (triple or more) buffers mechanism.

FIG. 3 illustrates a double (triple or more) buffers mechanism, arranged in accordance with at least some embodiments described herein.

As shown in diagram 300, data may be prefetched (reload operation) to a front buffer initially (302). Then, across the window buffer boundaries, data may be prefetched to shadow buffer as block 2 indicated by operation 1 (304). The front/shadow buffer may be switched as indicated by operation 2 (306) when the queued access in 304's front buffer completes, and then the switched shadow buffer may be restored to Flash as block 1 indicated by operation 3 (306). If access in block 2 completes (308), block 3's content may be prefetched into shadow buffer, and 308's front buffer may be stored to block 2 after the prefetch, and then switch front and shadow. The total number of shadow and front buffers may be two or more in practical implementations.

Figure 4:
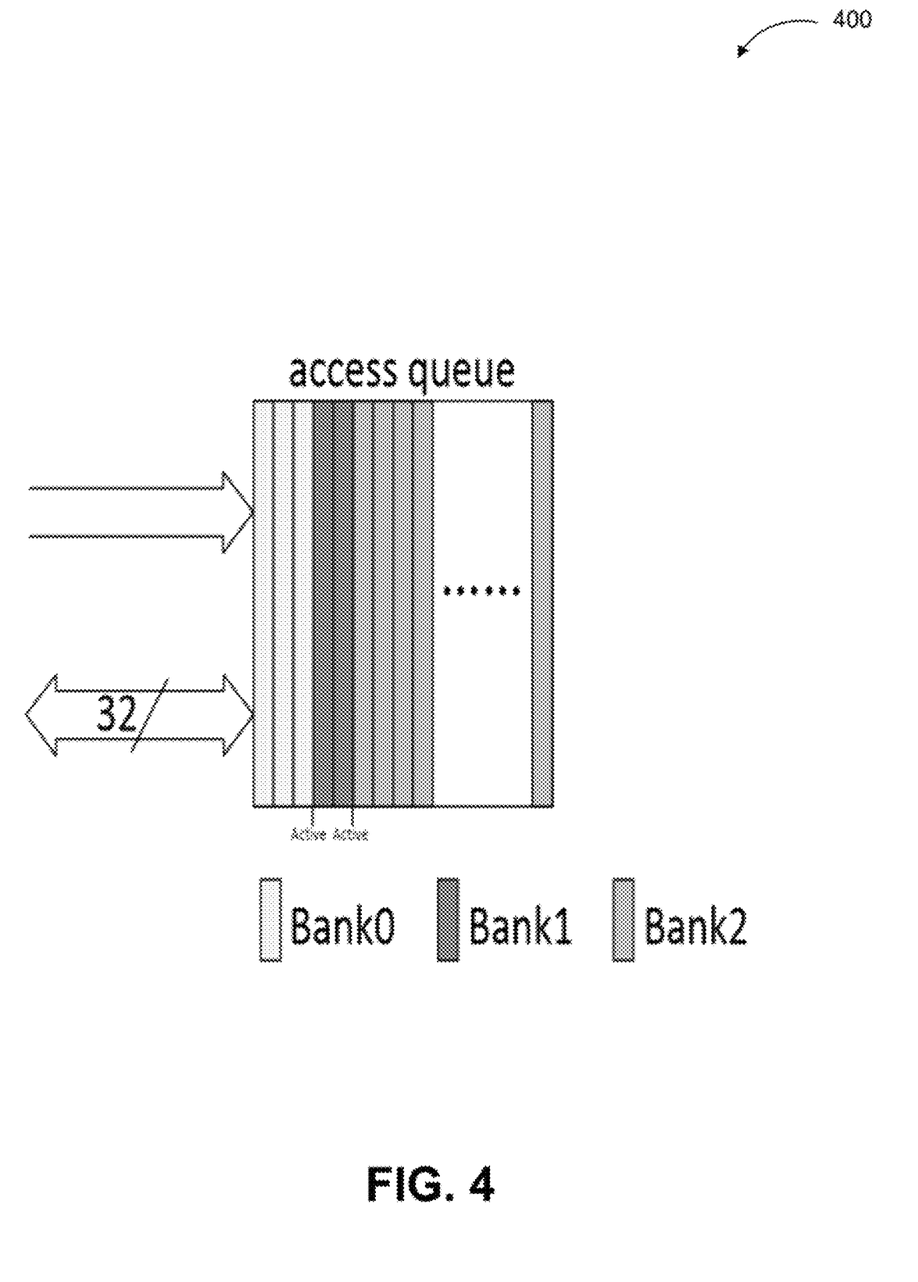
FIG. 4 is diagram illustrating an access queue design.

FIG. 4 is diagram illustrating an access queue design, arranged in accordance with at least some embodiments described herein.

As shown in diagram 400, an access queue for a system according to embodiments may be designed to buffer read/write addresses. An access in the same window may not send a prefetch command. Access across the window boundaries may prefetch the "next" window. Access queue embodies the mechanism of prefetch operations.

Figure 5:
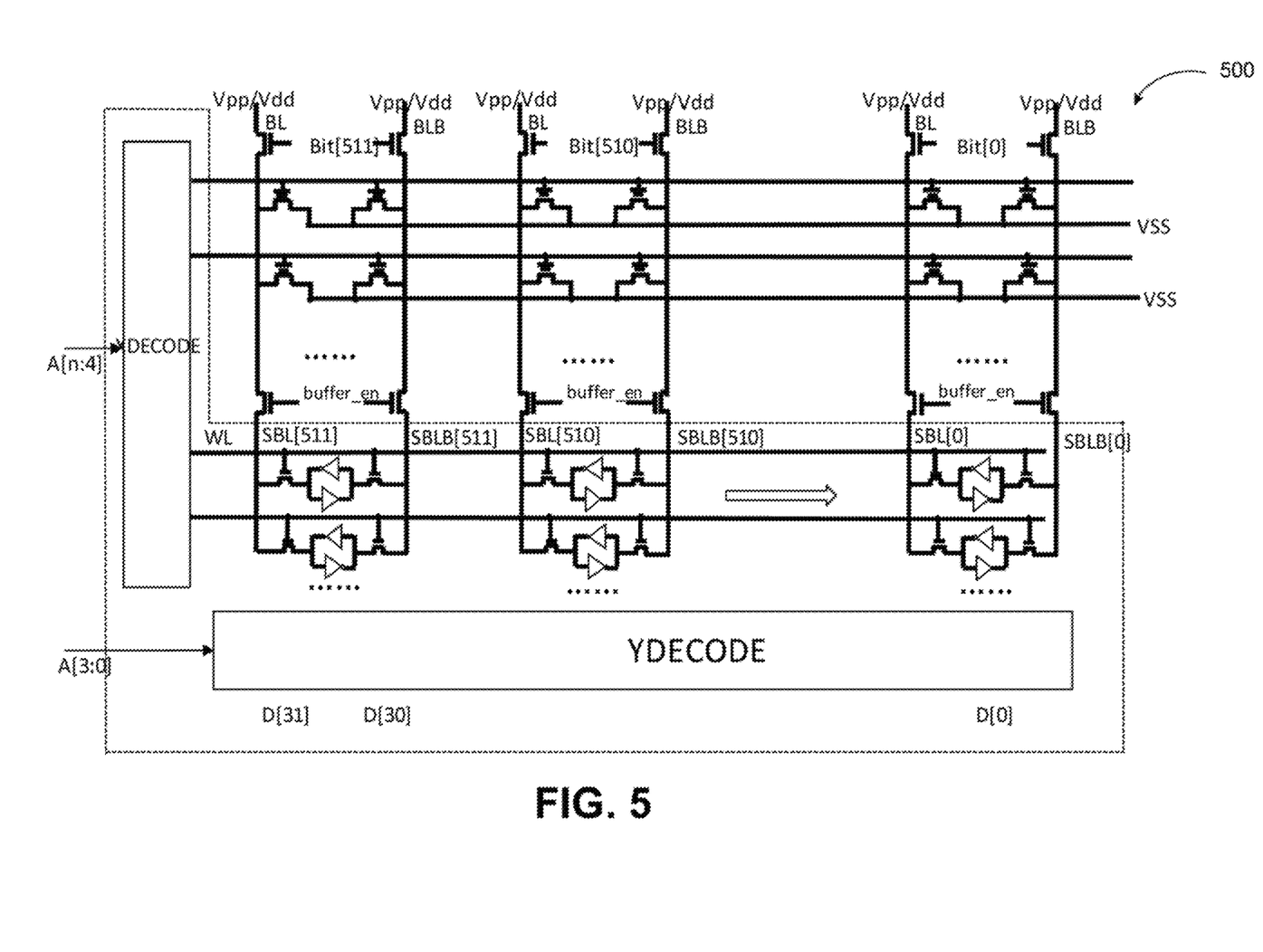
FIG. 5 is a schematic circuit diagram illustrating an example sharable SRAM buffer in HNVM.

FIG. 5 is a schematic circuit diagram illustrating an example sharable SRAM buffer in HNVM, arranged in accordance with at least some embodiments described herein.

As shown in diagram 500, an example implementation of a sharable SRAM buffer in HNVM may be formed in rows and columns. The SRAM buffer does not need to be a dedicated buffer, and can be shared as system SRAM. Higher bits may be used for WL decoding. Lower bits may be used for COL decoding. As shown in the example implementation diagram, for a 32 bit MCU, 512 bit lines consist of 16 COLs. Addr[3:0] may be used to decode 16 COLs. When buffer_en is disabled, SRAM block may be used as a pure SRAM and all address bits may be used in decoding. When buffer is enabled, Flash WL (window) can be backed up to SRAM WL directly, 32 bit width is seen from SRAM interface, 512 bit backup mechanism is achieved inside the hybrid memory.

Figure 6:
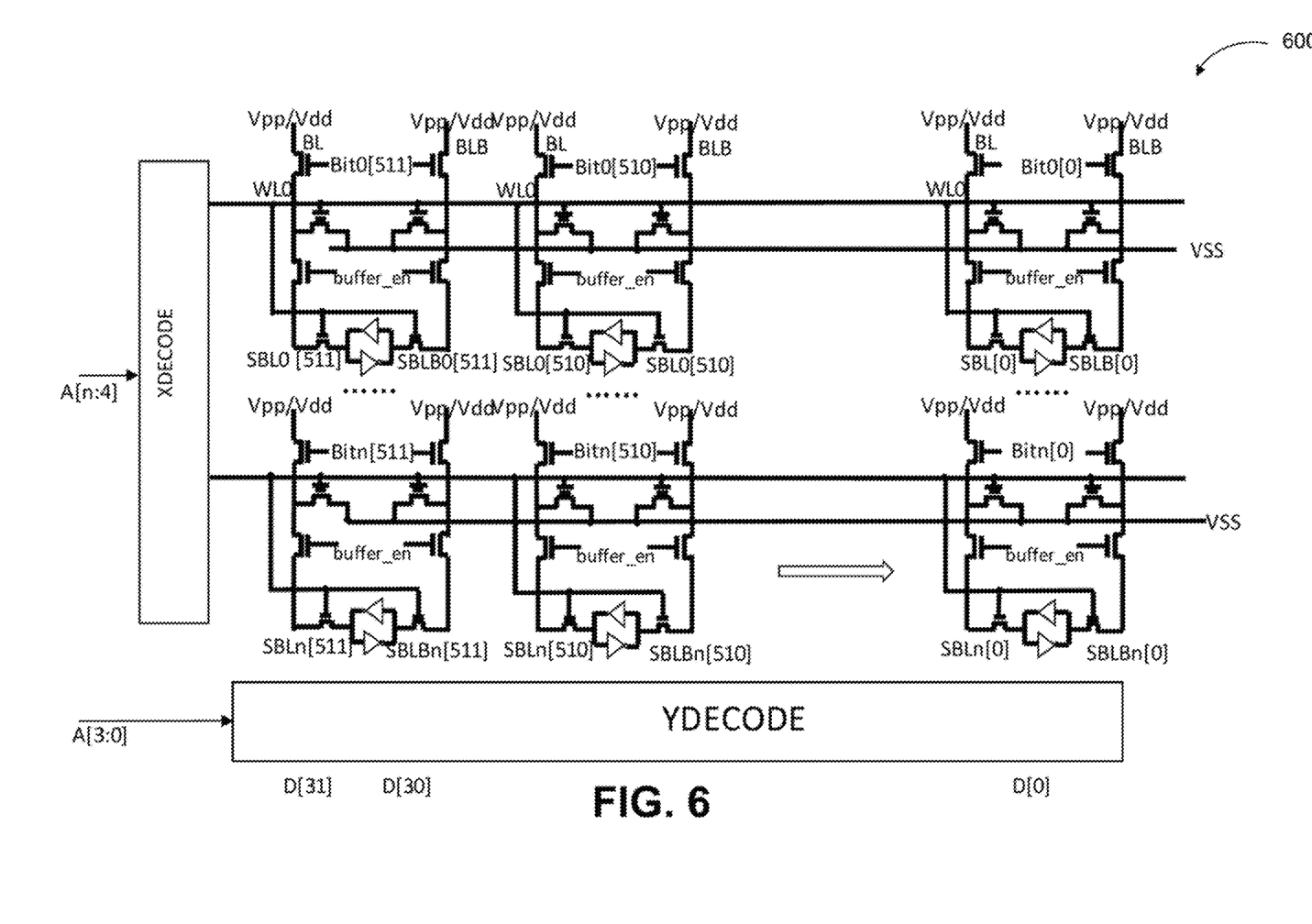
FIG. 6 is a schematic circuit diagram illustrating another example sharable SRAM buffer in HNVM.

FIG. 6 is a schematic circuit diagram illustrating another example sharable SRAM buffer in HNVM, arranged in accordance with at least some embodiments described herein.

Diagram 600 shows a different schematic implementation of the example implementation than the sharable SRAM buffer in HNVM shown in FIG. 5. In FIG. 6, each differential non-volatile memory cell has a SRAM buffer, where the higher bits may be used for WL decoding and the lower bits may be used for COL decoding. When buffer_en disabled, SRAM block may be used as a pure SRAM and all address bits may be used in decoding. When buffer_en is enabled, Flash WL (window) can be backed up to SRAM WL directly, 32 bit width is seen from SRAM interface, 512 bit backup mechanism is achieved inside the hybrid memory.

The major difference between the embodiments shown in FIG. 5, and FIG. 6, is that the diagram in FIG. 6 is one non-volatile cell to one SRAM cell mapping, and in the embodiment shown in FIG. 5 one SRAM cell can be mapped to multiple non-volatile cells in different rows. These two embodiments address the needs of both large SRAMs for non-volatile backup implementations and small SRAMs for area efficient non-volatile backup implementations.

Figure 7:
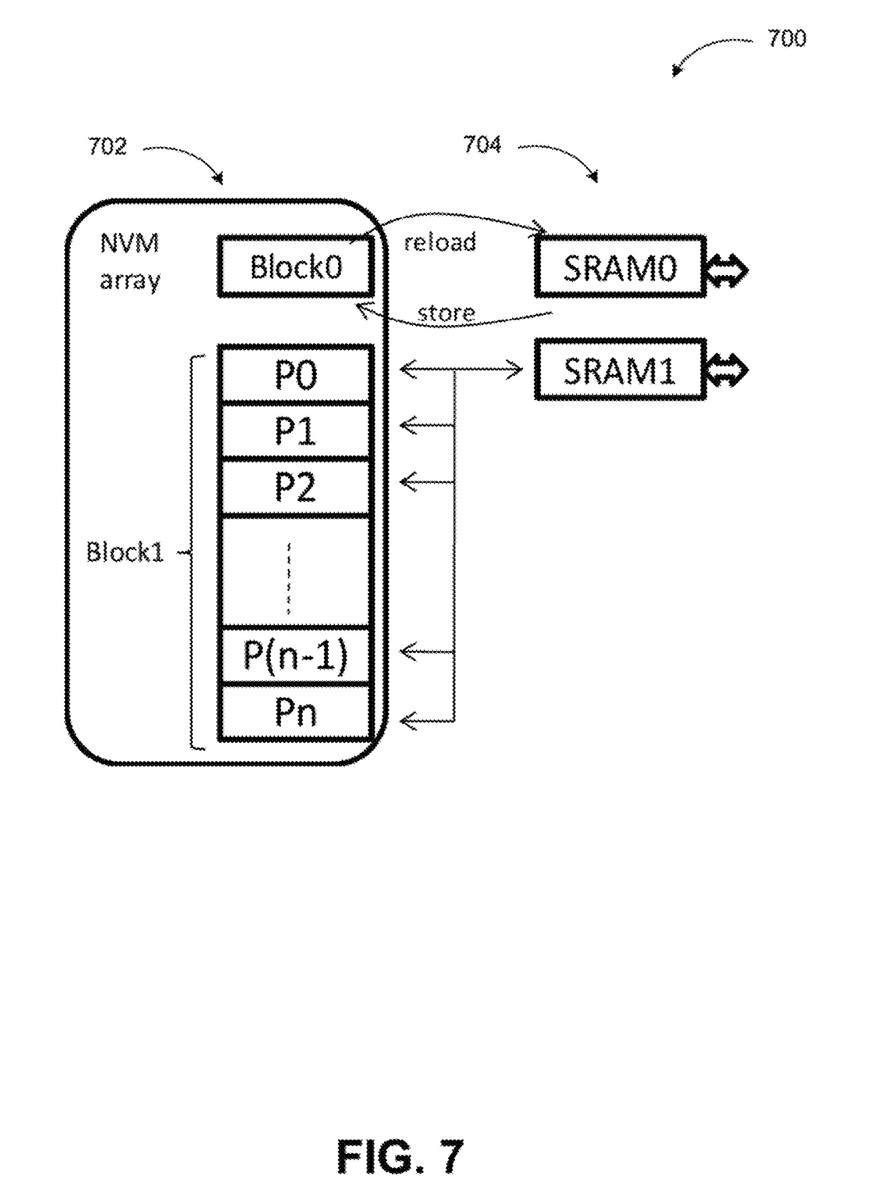
FIG. 7 through FIG. 9 illustrate various features of a hybrid memory with a high speed and high endurance block.
Figure 8:
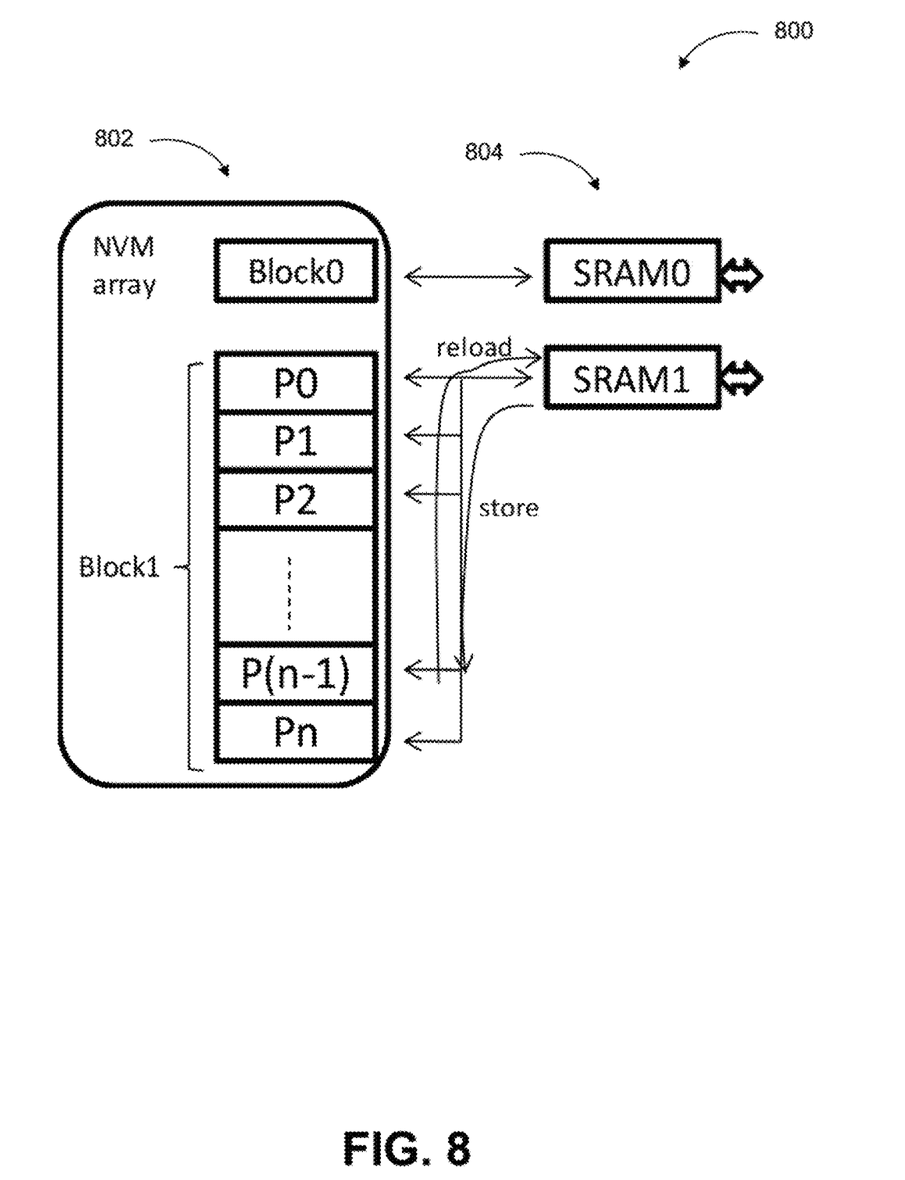
Figure 9:
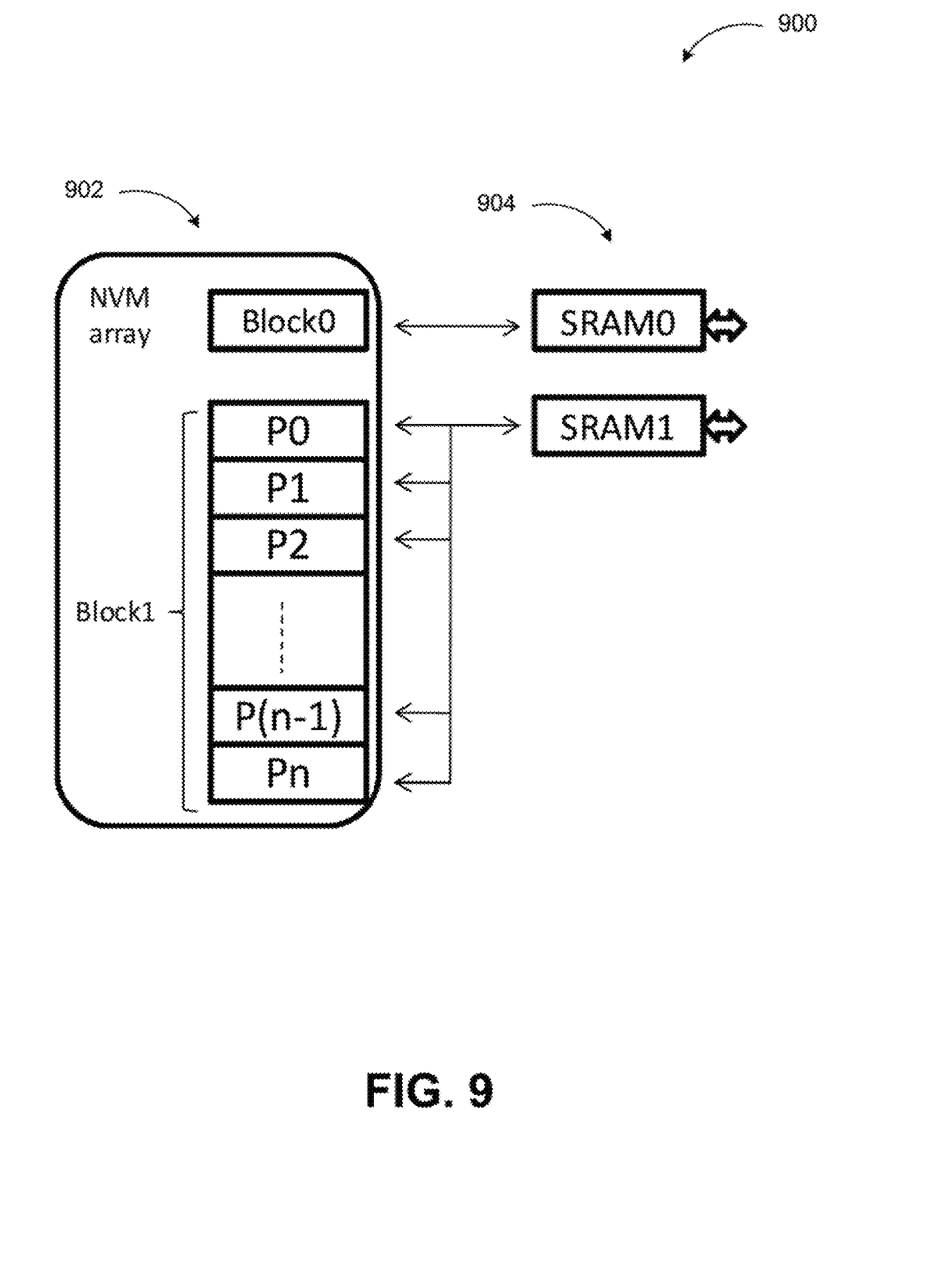

FIG. 7 through FIG. 9 illustrate various features of a hybrid memory with a high speed and high endurance block, arranged in accordance with at least some embodiments described herein.

In a memory system, some data may be changed frequently, while some data may not be changed frequently. Some data may need high endurance and/or high speed access. The different requirements may result in a need for different types of memory. A hybrid non-volatile memory according to some embodiments may include a high speed block and a high endurance block to store different types of data with different access needs. The HNVM may also include a normal block to store the data which is non-frequently changed.

As shown in diagram 700, a hybrid memory architecture with a high speed and high endurance blocks may include two NVM regions 702, an NVM block0 and an NVM block1. The NVM block1 may be divided into n small pages. The hybrid memory architecture may also include two SRAM blocks 704, SRAM0 may be directly mapped to the NVM block0 and SRAM1 may be mapped to one page of the NVM block1. SRAM0 may be directly mapped to the NVM block0, thus, NVM data may be loaded into SRAM at power up or a software reload.

Read/write data within the NVM block0 region may only use the SRAM0 when no power down achieving faster read/write speeds and non-limited data cycling. SRAM0 data may be backed up to the NVM block0 through a software store or hardware store (power down trigger). Thus, the data may be stored even at power off. In some embodiments, the hardware store may need an off-chip or an on-chip capacitor to supply the power. The store operation may cycle the NVM array. In one embodiment, the NVM block0 size may be equal to SRAM0. In another embodiment, the NVM block0 size may be a multiple of SRAM0 (not shown in figure). A wear leveling algorithm may be implemented to improve the NVM cycling when the store operation is frequently used.

As shown in diagram 800, SRAM0 of the SRAM 804 is mapped to NVM block0 of the NVM 802. SRAM1 may be mapped to any one page of NVM block1. In an example embodiment, SRAM1 may be a write buffer which maps to one of the pages of the NVM block1. The page data may be written to SRAM1 by a program instruction and backed up to the NVM array. In another embodiment, SRAM1 may be a buffer which maps to one of the pages for both read and write operations. The page data may be reloaded to SRAM1 by a software reload, as the SRAM has a fast access time. The page data may be written to SRAM1 by a program instruction, and then the data may be backed up to the NVM by the program instruction or a software store command.

A hybrid memory according to embodiments may have a large density and, as shown in diagram 900, NVM block0 of the NVM 902 may be used to store the data which frequently changed, as it has a high read/write speed and high endurance in conjunction with SRAM0 of the SRAM 904, NVM block 1 may be used to store the data which may not be frequently changed such as program code, parameters, etc. The SRAM1 may buffer the data and improve the read/write speed. As a result, NVM block1 may have a large density with a small buffer SRAM1, which may save on-chip SRAM area.

The NVM blocks, block0 and block1, may be put in a same array, but may also be separated. The NVM and SRAM connection may use array macro to macro, block-to-block structure, or even bit-to-bit connection. The NVM cells may be Flash memory cells such as floating gate cells. The NVM cells may also include other non-volatile type cells such as RRAM, MRAM, FRAM, and so on. In some embodiments, the hybrid memory may have multiple blocks for high speed and high endurance.

Some embodiments are directed to example processes to operate an HNVM device. The operations of any process described herein are not necessarily presented in any particular order and that performance of some or all of the operations in an alternative order(s) is possible and is contemplated. The operations have been presented in the demonstrated order for ease of description and illustration. Operations may be added, combined, modified, omitted, and/or performed simultaneously, in a different order, etc., without departing from the scope of the present disclosure.

The illustrated process can be ended at any time and need not be performed in its entirety. Some or all operations of the processes, and/or substantially equivalent operations, can be performed by execution by one or more processors of computer-readable instructions included on a computer storage media, such as described herein, including a tangible non-transitory computer-readable storage medium. The term "computer-readable instructions," and variants thereof, as used in the description and claims, is used expansively herein to include routines, applications, application modules, program modules, programs, components, data structures, algorithms, or the like. Computer-readable instructions can be implemented on various system configurations, including single-processor or multiprocessor systems, mini-computers, mainframe computers, personal computers, hand-held computing devices, microprocessor-based, programmable consumer electronics, combinations thereof, or the like.

Figure 10:
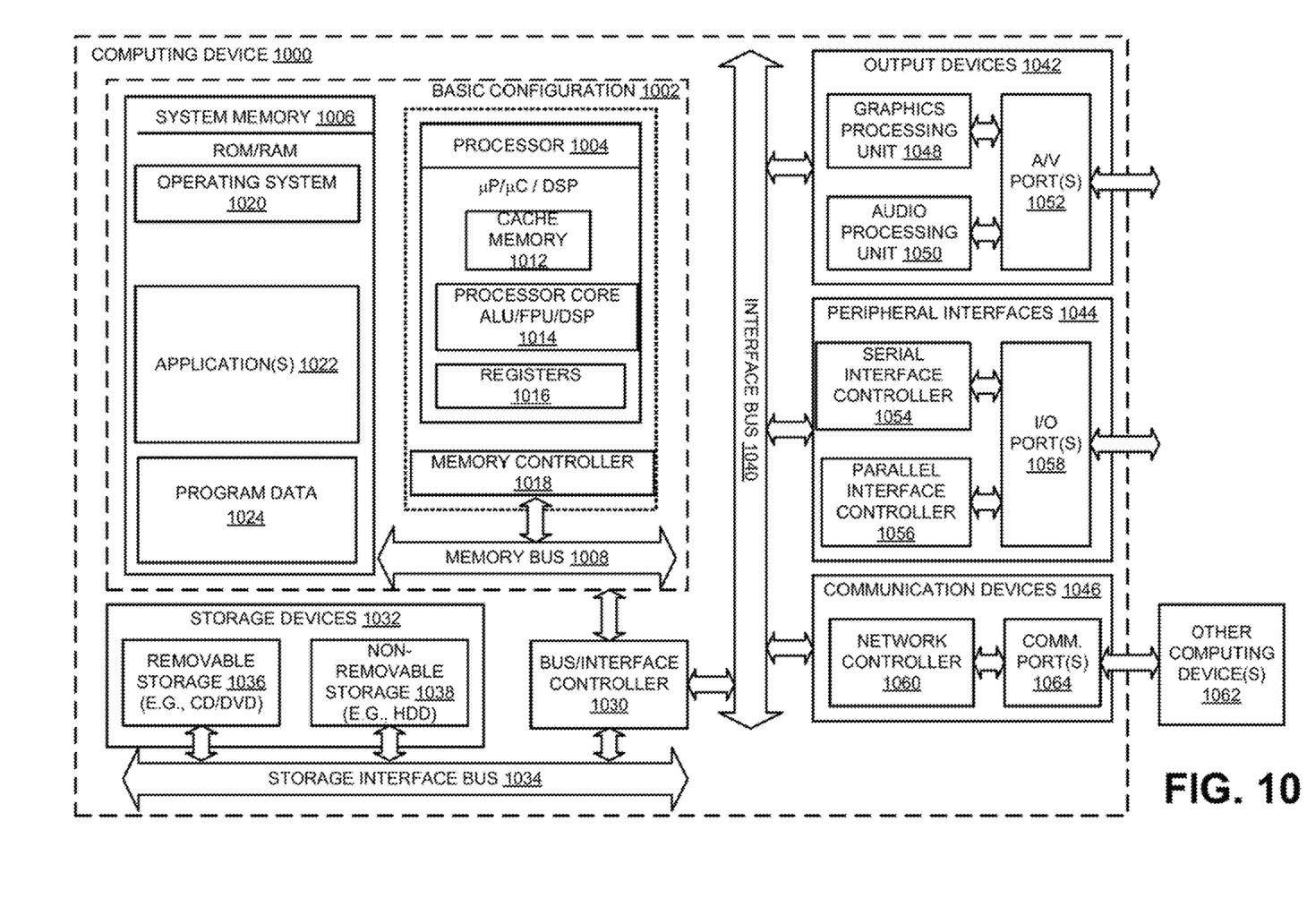
FIG. 10 is a block diagram illustrating an example computing device that is arranged for implementing HNVM based memory structures discussed herein.

FIG. 10 is a block diagram illustrating an example computing device that is arranged for implementing, HNVM based memory structures discussed herein. In a basic configuration 1002, computing device 1000 typically includes one or more processors 1004 and system memory 1006. A memory bus 1008 can be used for communicating between the processor 1004 and the system memory 1006.

Depending on the desired configuration, processor 1004 can be of any type including but not limited to a microprocessor (μP), a microcontroller (μC) a digital signal processor (DSP), or any combination thereof. Processor 1004 can include one more levels of caching, such as cache memory 1012, a processor core 1014, and registers 1016. The processor core 1014 can include an arithmetic logic unit (ALU), a floating point unit (FPU), a digital signal processing core (DSP core), or any combination thereof. A memory controller 1018 can also be used with the processor 1004, or in some implementations the memory controller 1010 can be an internal part of the processor 1004.

Depending on the desired configuration, the system memory 1006 can be of any type including but not limited to volatile memory (such as RAM), non-volatile memory (such as ROM, flash memory, etc.) or any combination thereof. System memory 1006 typically includes an operating system 1020, one or more applications 1022, and program data 1024.

Computing device 1000 can have additional features or functionality, and additional interfaces to facilitate communications between the basic configuration 1002 and any required devices and interfaces. For example, a bus/interface controller 1040 can be used to facilitate communications between the basic configuration 1002 and one or more data storage devices 1032 via a storage interface bus 1034. The data storage devices 1032 can be removable storage devices 1036, non-removable storage devices 1038, or a combination thereof. Examples of removable storage and non-removable storage devices include magnetic disk devices such as flexible disk drives and hard-disk drives (HDDs), optical disk drives such as compact disk (CD) drives or digital versatile disk (DVD) drives, solid state drives (SSDs), and tape drives to name a few. Example computer storage media can include volatile and nonvolatile, removable and non-removable media implemented in any method or technology for storage of information, such as computer readable instructions, data structures, program modules, or other data.

System memory 1006, removable storage 1036 and non-removable storage 1038 are all examples of computer storage media. Computer storage media includes, but is not limited to, RAM, ROM, EEPROM, flash memory or other memory technology, CD-ROM, digital versatile disks (DVDs) or other optical storage, magnetic cassettes, magnetic tape, magnetic disk storage or other magnetic storage devices, or any other medium which can be used to store the desired information and which can be accessed by computing device 1000. Any such computer storage media can be part of device 1000. Thus, any of the computer storage media may be implemented using the SRAM based memory structures as discussed herein.

Computing device 1000 can also include an interface bus 1040 for facilitating communication from various interface devices (e.g., output interfaces, peripheral interfaces, and communication interfaces) to the basic configuration 1002 via the bus/interface controller 1030. Example output devices 1042 include a graphics processing unit 1048 and an audio processing unit 1050, which can be configured to communicate to various external devices such as a display or speakers via one or more A/V ports 1052. Example peripheral interfaces 1044 include a serial interface controller 1054 or a parallel interface controller 1056, which can be configured to communicate with external devices such as input devices (e.g., keyboard, mouse, pen, voice input device, touch input device, etc.) or other peripheral devices (e.g., printer, scanner, etc.) via one or more I/O ports 1058. An example communication device 1046 includes a network controller 1060, which can be arranged to facilitate communications with one or more other computing devices 1062 over a network communication via one or more communication ports 1064. The communication connection is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, communication media can include wired media such as a wired network or direct-wired connection, and wireless media such as acoustic, radio frequency (RF), infrared (IR) and other wireless media. The term computer readable media as used herein can include both storage media and communication media.

Computing device 1000 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 1000 can also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, are possible. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, compounds, or compositions, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations.

However, the use of such phrases should not be construed to imply that the introduction of a claim recitation by the indefinite articles "a" or "an" limits an particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include, but not be limited to, systems that have A alone, B alone. C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

Further, the use of the terms "first," "second," "third," "fourth," and the like to distinguish between repeated instances of a component or a step in a process and does not impose a serial or temporal limitations unless specifically stated to require such serial or temporal order.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," or the like include the number recited and refer to ranges which can be subsequently broken down into subranges as discussed above. Finally, as will be understood by one skilled in the art, a range includes each individual member. Thus, for example, a group having 1-3 elements refers to groups having 1, 2, or 3 elements. Similarly, a group having 1-5 elements refers to groups having 1, 2, 3, 4, or 5 elements, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the following claims.

What is claimed is:

1. A hybrid memory device, comprising:
   a static random access memory (SRAM) array having a plurality of SRAM blocks; and
   a non-volatile memory (NVM) array having a plurality of NVM blocks, wherein
      a portion of the NVM array is configured to be mapped to a plurality of SRAM buffers to store data,
      a data exchange between the SRAM array and the NVM array is at bit-level, and
      the SRAM buffers are configured as a shareable system SRAM.

2. The hybrid memory device of claim 1, wherein each SRAM buffer is configured as having multiple buffer mechanisms comprising a double buffer mechanism, a front buffer, and a shadow buffer.

3. The hybrid memory device of claim 2, wherein in response to a data access operation crossing a buffer window boundary, data from a first NVM block is prefetched to the front buffer, data from a second NVM block is prefetched to the shadow buffer, the front buffer and the shadow buffer are switched, and the shadow buffer is restored to where the NVM block is prefetched from.

4. The hybrid memory device of claim 3, wherein an access queue for the hybrid memory device is configured such that a data access operation within a same buffer window does not send a prefetch command and another data access operation across buffer window boundaries sends a prefetch command for a next window.

5. The hybrid memory device of claim 1, wherein in response to a buffer enable signal being present, data stored in an NVM block configured as SRAM buffer is backed up to a corresponding SRAM block directly or data stored in the SRAM block is stored back to NVM block directly.

6. The hybrid memory device of claim 1, wherein in response to a buffer enable signal not being present, the data to be stored in the portion of the NVM array mapped to the plurality of SRAM buffers is stored directly to the SRAM and all address bits are used for decoding.

7. The hybrid memory device of claim 1, wherein higher address bits are used for word line decoding and lower address bits are used for column decoding.

8. The hybrid memory device of claim 7, wherein the SRAM buffers are configured as non-dedicated buffers.

9. The hybrid memory device of claim 1, wherein a size of NVM blocks is a multiple of a size of SRAM blocks.

10. The hybrid memory device of claim 1, wherein the NVM memory comprises one of a floating gate memory device, a SONOS memory device, a resistive RAM (RRAM) device, a phase change memory, a ferroelectric memory, a magnetic base memory (MRAM), a DRAM device, a one time programmable memory (OTP), or a multiple time programmable memory (MTP).

11. A hybrid memory device, comprising:
    a static random access memory (SRAM) array having a plurality of SRAM blocks; and
    a non-volatile memory (NVM) array having a plurality of NVM blocks, wherein
       a portion of the NVM array is configured to be mapped to a plurality of SRAM buffers to store data,
       the SRAM buffers are configured as a shareable system SRAM, and
       in response to a buffer enable signal not being present, the data to be stored in the portion of the NVM array mapped to the plurality of SRAM buffers is stored directly to the SRAM and all address bits are used for decoding.

12. The hybrid memory device of claim 11, wherein each SRAM buffer is configured as having multiple buffer mechanisms comprising a double buffer mechanism, a front buffer, and a shadow buffer.

13. The hybrid memory device of claim 12, wherein in response to a data access operation crossing a buffer window boundary, data from a first NVM block is prefetched to the front buffer, data from a second NVM block is prefetched to the shadow buffer, the front buffer and the shadow buffer are switched, and the shadow buffer is restored to where the NVM block is prefetched from.

14. The hybrid memory device of claim 13, wherein an access queue for the hybrid memory device is configured such that a data access operation within a same buffer window does not send a prefetch command and another data access operation across buffer window boundaries sends a prefetch command for a next window.

15. The hybrid memory device of claim 11, wherein in response to a buffer enable signal being present, data stored in an NVM block configured as SRAM buffer is backed up to a corresponding SRAM block directly or data stored in the SRAM block is stored back to NVM block directly.

16. The hybrid memory device of claim 11, wherein higher address bits are used for word line decoding and lower address bits are used for column decoding.

17. The hybrid memory device of claim 16, wherein the SRAM buffers are configured as non-dedicated buffers.

18. The hybrid memory device of claim 11, wherein a size of NVM blocks is a multiple of a size of SRAM blocks.

19. The hybrid memory device of claim 11, wherein the NVM memory comprises one of a floating gate memory device, a SONOS memory device, a resistive RAM (RRAM) device, a phase change memory, a ferroelectric memory, a magnetic base memory (MRAM), a DRAM device, a one time programmable memory (OTP), or a multiple time programmable memory (MTP).

20. A hybrid memory device, comprising:
    a static random access memory (SRAM) array having a plurality of SRAM blocks; and
    a non-volatile memory (NVM) array having a plurality of NVM blocks, wherein
       a portion of the NVM array is configured to be mapped to a plurality of SRAM buffers, the SRAM buffers are configured as a shareable system SRAM, and in response to a buffer enable signal being present, data stored in an NVM block configured as SRAM buffer is backed up to a corresponding SRAM block directly or data stored in the SRAM block is stored back to NVM block directly.

* * * * *